US012695441B2

(12) United States Patent
Gupta et al.

(10) Patent No.: US 12,695,441 B2
(45) Date of Patent: Jul. 28, 2026

(54) GLITCH FILTER CIRCUITRY FOR DEVICE-TO-DEVICE COMMUNICATION SYSTEM INTERFACE

(71) Applicant: Advanced Micro Devices, Inc., Santa Clara, CA (US)

(72) Inventors: Piyush Gupta, Bangalore (IN); Rajesh Mangalore Anand, Bangalore (IN); Jagadeesh A S, Bangalore (IN); Ajay Mandira Cariappa, Bangalore (IN); Shreevatsa M, Bangalore (IN); Girish A S, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 57 days.

(21) Appl. No.: 18/783,174

(22) Filed: Jul. 24, 2024

(65) Prior Publication Data

US 2026/0031793 A1 Jan. 29, 2026

(51) Int. Cl.
H03H 11/04 (2006.01)
H03K 3/037 (2006.01)
H03K 19/20 (2006.01)

(52) U.S. Cl.
CPC .............. H03H 11/04 (2013.01); H03K 3/037 (2013.01); H03K 19/20 (2013.01)

(58) Field of Classification Search
CPC ......... H03H 11/04; H03K 3/037; H03K 19/20
USPC ....................................................... 327/552
See application file for complete search history.

(56) References Cited

U.S. PATENT DOCUMENTS

| | | | | |
|---|---|---|---|---|
| 7,002,427 | B2 * | 2/2006 | Nystrom | H03L 7/0816 |
| | | | | 455/340 |
| 7,397,292 | B1 * | 7/2008 | Potanin | H03K 5/1252 |
| | | | | 327/552 |
| 8,010,724 | B2 | 8/2011 | Wortham et al. | |
| 9,256,570 | B2 | 2/2016 | Jadus et al. | |
| 10,873,325 | B2 * | 12/2020 | Malakar | H03K 17/6872 |
| 11,558,044 | B2 * | 1/2023 | Malakar | H03K 5/1252 |
| 11,909,406 | B1 * | 2/2024 | Hussein | H03L 7/093 |
| 2007/0001743 | A1 * | 1/2007 | Wei | H02M 3/073 |
| | | | | 327/427 |
| 2020/0119726 | A1 * | 4/2020 | Malakar | H03K 5/1252 |
| 2021/0075411 | A1 * | 3/2021 | Malakar | H03K 17/6872 |
| 2021/0320647 | A1 | 10/2021 | Mertens | |
| 2021/0336606 | A1 | 10/2021 | Tiwari et al. | |
| 2023/0388162 | A1 * | 11/2023 | Zhong | H04B 1/10 |
| 2024/0012052 | A1 * | 1/2024 | Marumoto | H03K 19/17728 |

(Continued)

*Primary Examiner* — Ryan Jager
(74) *Attorney, Agent, or Firm* — Patterson + Sheridan, LLP

(57) ABSTRACT

A computing system includes a communication system comprising a glitch filter circuitry disposed in an integrated circuit (IC) device configured to receive an input signal and provide a glitch filter output signal based on the input signal. The glitch filter circuitry includes a control path circuitry configured to receive the input signal and generate a control signal based on detecting a glitch within the input signal, the control path circuitry including a configurable resistor capacitor (RC) filter circuitry configured to deliver a configurable RC filter circuitry output signal based on one or more selection signals. The control signal is based on the configurable RC filter circuitry output signal, and a data path circuitry configured to receive the control signal and mitigate glitches within the input signal based on the control signal.

20 Claims, 6 Drawing Sheets

(56)         References Cited

U.S. PATENT DOCUMENTS

| | | | |
|---|---|---|---|
| 2024/0146290 A1* | 5/2024 | Masuda | G01C 3/06 |
| 2024/0154604 A1* | 5/2024 | Gao | H03H 11/126 |
| 2024/0213968 A1* | 6/2024 | Kumar | H03K 17/16 |
| 2025/0007518 A1* | 1/2025 | Terauchi | H03K 19/00384 |
| 2025/0020015 A1* | 1/2025 | Conway | E05F 15/70 |

* cited by examiner

GLITCH FILTER CIRCUITRY FOR DEVICE-TO-DEVICE COMMUNICATION SYSTEM INTERFACE

TECHNICAL FIELD

An embodiment relates to device-to-device communication systems. In particular, embodiments herein relate to a glitch filter circuitry used in a device-to-device communication system.

BACKGROUND

Many device-to-device communication systems include synchronous serial communication. Synchronous serial communication systems are communication systems in which data is sent in continuous stream of bits at a constant rate. Examples of device-to-device communication systems include, but are not limited to, inter integrated circuit communication (I2C) protocol, serial peripheral interface (SPI) protocol or the like. However, due to data being transferred in a continuous stream of bits, synchronous serial communication systems are susceptible to noise spikes (i.e., glitches).

SUMMARY

According to one or more examples, a computing system includes a communication system comprising a glitch filter circuitry disposed in an integrated circuit (IC) device configured to receive an input signal and provide a glitch filter output signal based on the input signal, the glitch filter circuitry including a control path circuitry configured to receive the input signal and generate a control signal based on detecting a glitch within the input signal, the control path circuitry including a configurable resistor capacitor (RC) filter circuitry configured to deliver a configurable RC filter circuitry output signal based on one or more selection signals, wherein the control signal is based on the configurable RC filter circuitry output signal, and a data path circuitry configured to receive the control signal and mitigate glitches within the input signal based on the control signal.

According to one or more examples, glitch filter circuitry includes a control path circuitry configured to receive an input signal and generate a control signal based on detecting a glitch within the input signal, the control path circuitry including a configurable resistor capacitor (RC) filter circuitry configured to deliver an configurable RC filter circuitry output signal based on one or more selection signals, wherein the control signal is based on the configurable RC filter circuitry output signal, and a data path circuitry configured to receive the control signal and mitigate glitches within the input signal based on the control signal.

According to one or more examples, a method includes receiving, by a control path circuitry of a glitch filter circuitry of an IC device of a communication system, an input signal, generating, by a configurable resistor capacitor (RC) filter circuitry of the control path circuitry, a configurable RC filter circuitry output signal, wherein the configurable RC filter circuitry output signal is based on one or more selection signals received by the configurable RC filter circuitry, generating, by the control path circuitry, a control signal based on the configurable RC filter circuitry output signal, and mitigating, by a data path circuitry, glitches within the input signal based on the control signal.

DETAILED DESCRIPTION

Figure 1A:
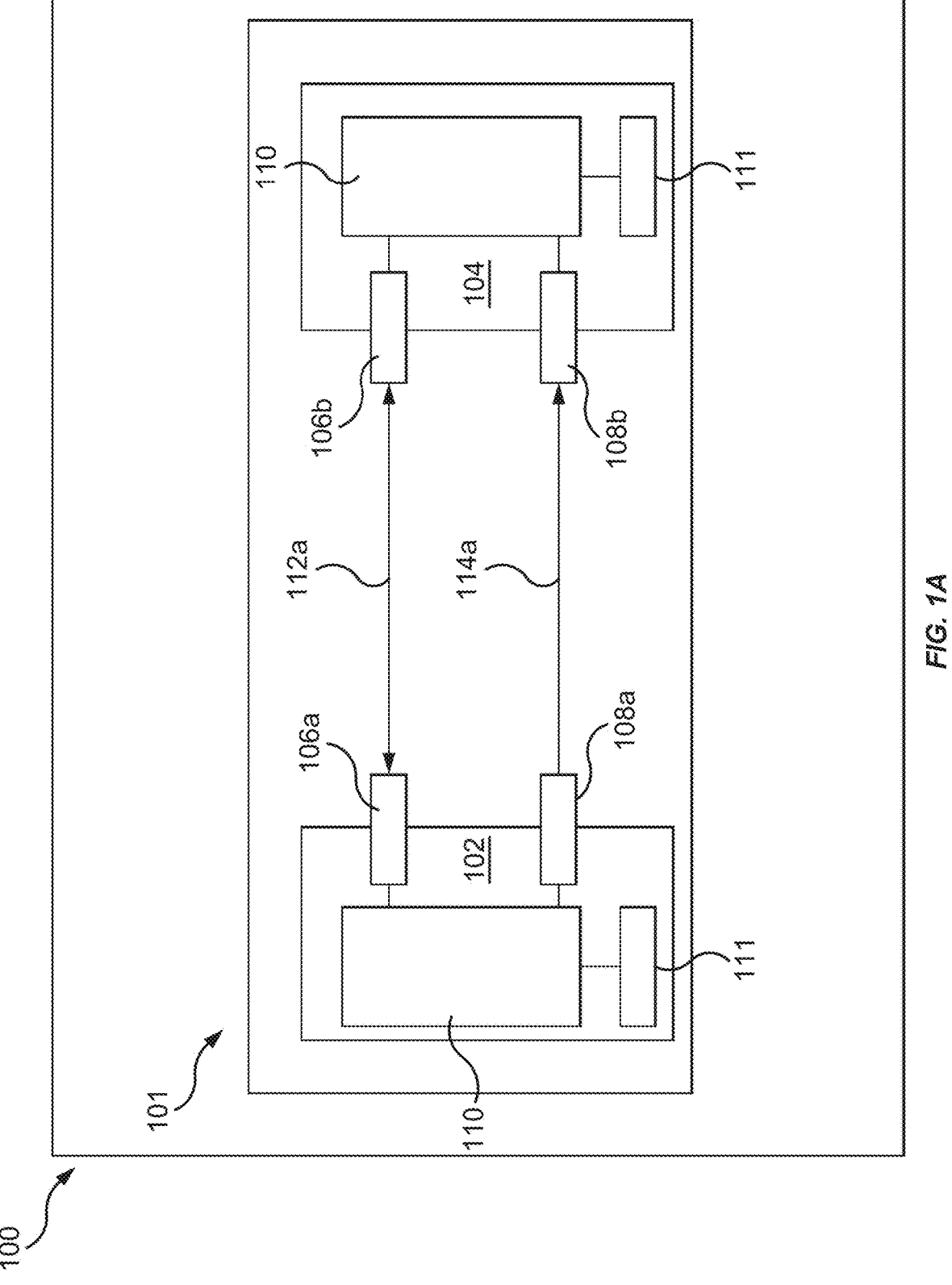
FIG. 1A illustrates a block diagram depicting an exemplary computing system 100, according to one or more examples.

Synchronous serial communication systems are communication systems that widely used in embedded systems where data is transferred between electronic devices on the bus in a continuous stream of bits. One example of a synchronous serial communication system is an inter integrated circuit communication (I2C) communication system. An I2C communication system is a two-wire serial communication bus standard that is widely used in embedded systems. However, the continuous stream of bits of data makes synchronous serial communication systems susceptible to noise. Conventional noise filtering methods include using resistor capacitor (RC) filter circuitry to mitigate noise spikes (i.e., glitches) that can cause data corruption within the integrated circuit (IC) devices of the synchronous serial communication systems. The RC filter circuitry may be used to suppress noise spikes that have a pulse width less than a prescribed synchronous serial communication systems standard. For example, I2C protocol requires noise spikes of less than 50 ns, to be filtered. For example, RC filter circuitries are used to delay the input signal to filter out fast input signal pulses (i.e., glitches).

However, the conventional RC filter circuitries are not able to mitigate (e.g., suppress) all glitches less than 50 ns and may cause additional problems. For example, conventional RC filter circuitries (and other conventional noise filtering methods such as glitch filter circuitries, and Schmitt triggers) may cause duty cycle distortion. Stated otherwise, conventional RC filter circuitries may cause mismatched rising and falling edges between the input signals received and output signals transmitted due to process, voltage, and temperature (PVT) variations of passive element values within the IC device. The mismatch between rising and falling edges can cause the IC device to fail to function correctly as some IC devices may be expecting the signals to have a certain duty cycle or arrive at a certain time. Furthermore, some IC devices are designed to sample the input signal at a specific point in time. If the input signal arrives at a different time than expected, the data that is sampled may be incorrect, causing errors in the sampled data.

IC devices are prone to noise from switching between a voltage supply voltage and a ground voltage. The change in supply voltage and ground voltage levels can cause the false detection of input signals in an IC device that cause malfunction and erratic output signal behavior. Furthermore, conventional noise filtering methods are prone to false data detection. For example, continuous noise spikes (i.e., fast transactions/glitches) may prevent proper discharge of the RC filter circuitry, and lead to false data detection. As another example, there may not be enough time for the RC filter to charge/discharge resulting in shorter pulses and signal quality degradation. Another issue is that the resistance (R) and capacitance (C) values of the RC filter circuitries (i.e., the RC constant) is inconsistent across IC devices. Therefore, some RC filter circuitries in the communication system may not be able to keep up with in the incoming signal. Stated otherwise, each RC filter circuitry has a fixed time constant limitation that requires precise R and C values that are susceptible to variations. Deviations from the precise RC constant results in an ineffective RC filter circuitry that causes critical data transmission failures. Other conventional noise filter methods may have other disadvantages. Conventional glitch filters are a specialized type of filter that are designed to filter out the noise spikes. However, conventional glitch filters are more expensive due to their size and complexity and may not be suitable for all device designs.

In one or more examples, Schmitt triggers may be used in lieu of a glitch filter circuitry. Schmitt triggers are a digital logic gate that has two thresholds, a low and a high threshold voltage. Schmitt triggers filter out noise glitches by changing state only when the input signal crosses either threshold. However, Schmitt triggers are susceptible to PVT variations and are not able to filter out all of the noise.

Embodiments herein relate to glitch filter circuitry that includes configurable RC filter circuitry that can be adjusted dynamically. In particular, embodiments herein relate to glitch filter circuitry that includes configurable RC filter circuitry including a configurable RC constant that can be adjusted to ensure glitches having a pulse width less than a desired pulse width (glitch pulse width) are filtered.

FIG. 1A illustrates a block diagram depicting an exemplary computing system 100, according to one or more examples. The computing system 100 includes an communication system 101. In one or more examples, the computing system 100 may be a laptop, personal computer, tablet, mobile device, or any other device that utilizes synchronous serial communication, such as I2C communication. In one or more examples, the communication system 101 includes a plurality (i.e., two or more) of IC (integrated circuit) devices. In one or more examples, the IC devices are able to communicate via the protocol of the communication system 101. The IC devices may be processing device such as a CPU, GPU, among others a memory device, control circuitry device such as a memory controller or an input-output interface control circuitry, or the like. The communication system 101 includes at least one master IC device and at least one slave IC device. For example, the communication system 101 includes a first IC device 102 and a second IC device 104. The first IC device 102 may be the master IC device, and the second IC device 104 may be the slave IC device. The quantity of IC devices are not limited, any quantity of IC devices may be included in the communication system 101.

The communication system 101 is used as a way to bi-directionally transfer data between the first IC device 102 and the second IC device 104 (or any additional IC devices). Stated otherwise, the communication system 101 is an I2C communication system. Although the communication system 101 is described herein as an I2C communication, the type of communication system 101 is not limited. The communication system 101 uses a serial data (SDA) line 112a and a serial clock (SCL) line 114a to communicate. In one or more examples, the SDA line 112a and the SCL line are both a communication BUS. The first (master) IC device 102 is able to transmit and receive data from the second (slave) IC device 104 via the SDA line 112a. The data is transferred in a continuous stream of bits. The first IC device 102 is also able to transmit a synchronous clock signal to the second IC device 104 (and any additional slave IC devices) using the SCL line 114a.

The first IC device 102 includes a first SDA pin 106a and a first SCL pin 108a. The first SDA pin 106a is coupled to the SDA line 112a and used to transmit and receive data via the SDA line 112a. The first SCL pin 108a is coupled to the SCL line 114a, and is used to transmit the synchronous clock signal via the SCL line 114a. The second IC device 104 device includes a second SDA pin 106b and a second SCL pin 108b. The second SDA pin 106b is coupled to the SDA line 112a and used to transmit and receive data via the SDA line 112a. The second SCL pin 108b is coupled to the SCL line 114a, and is used to receive the synchronous clock signal via the SCL line 114a.

As noted above, because the data transferred within the communication system 101 in a continuous stream of bits, the data is more susceptible to noise, thereby causing data corruption. Thus, to mitigate the noise issues, each IC device includes a filter circuitry 110. In one or more examples, the filter circuitry 110 is configured to filter out noise in both the data signal and synchronous clock signals. The filter circuitry 110 is configured to output a filtered signal to additional processing circuitry in the corresponding IC device for further processing. Although the filter circuitry 110 is illustrated as being included in both IC devices, this is for example purposes only, and only at least one of the IC device is required to include the filter circuitry 118.

The first IC device 102 and the second IC device 104 each include a controller circuitry 111. The controller circuitry 111 may be a central processing unit (CPU), a system on chip (SoC), an application specific integrated circuitry (ASIC) device, or any other suitable controller circuitry. In one or more examples, the controller circuitry 111 is able to configure the filter circuitry 110 by transmitting resistance and capacitance control signals to glitch filter circuitry 120 (FIG. 1B and FIGS. 2-4) within the filter circuitry 110. In other examples, the controller circuitry 111 is able to provide instructions to the corresponding IC device to transmit a data signal and/or a synchronous clock signal.

Figure 1B:
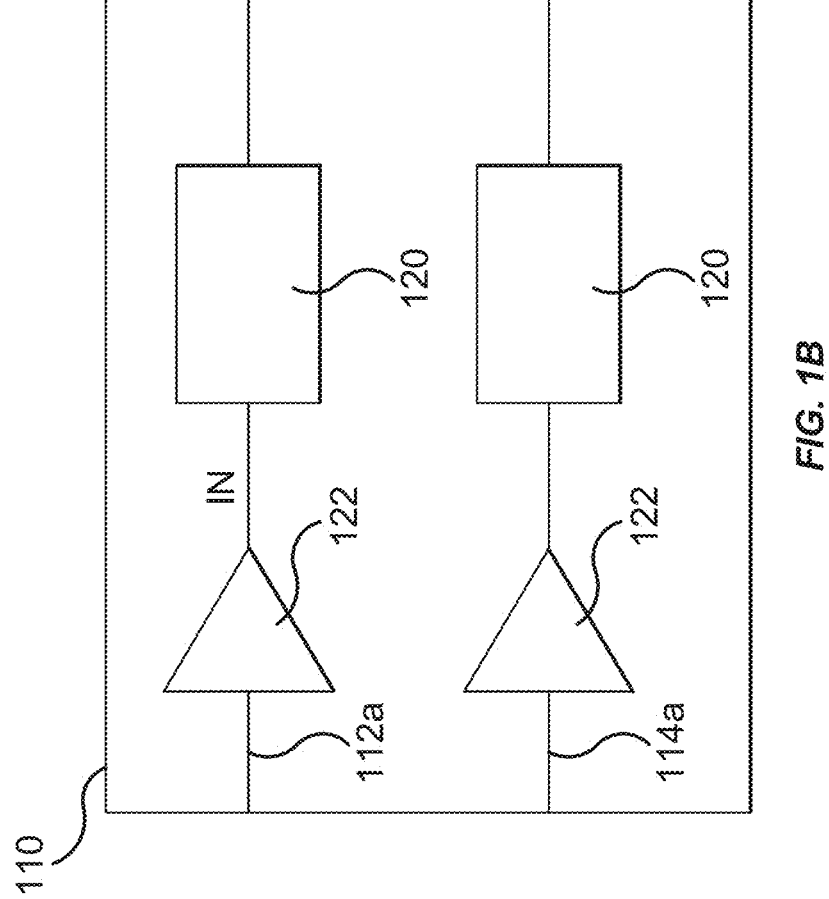
FIG. 1B illustrates a block diagram depicting a filter circuitry, according to one or more examples.

FIG. 1B illustrates a block diagram depicting a filter circuitry 110, according to one or more examples. In one or more examples, the filter circuitry 110 includes glitch filter circuitry 120 that is coupled to the threshold level circuitry 122. In one or more examples, the threshold level circuitry 122 is a Schmitt trigger circuitry. In other examples, other types of threshold levels may be used. The filter circuitry 110 includes glitch filter circuitry 120 coupled to the threshold level circuitry 122 on both circuit paths of an IC device. For example, glitch filter circuitry 120 and a threshold level circuitry 122 are coupled to the SDA line 112a, and a glitch filter circuitry 120 and threshold level circuitry 122 are coupled to the SCL line 112b. Stated otherwise, filter circuitry 110 is able to filter glitches out of both a data signal and a synchronous clock signal. The filter circuitry 110 receives the data signal and/or synchronous clock signals. The data signal and/or synchronous clock signals are received by the threshold level circuitry 122. The threshold level circuitry 122 processes the data signal or synchronous clock signal and delivers an input signal IN to the glitch filter circuitry 120. The glitch filter circuitry 120 receives the input signal IN and delivers a glitch filter output signal glitch_OUT to via the corresponding SDA line 112a or the corresponding SCL line 112b and then other IC devices in the communication system 101.

Figure 2:
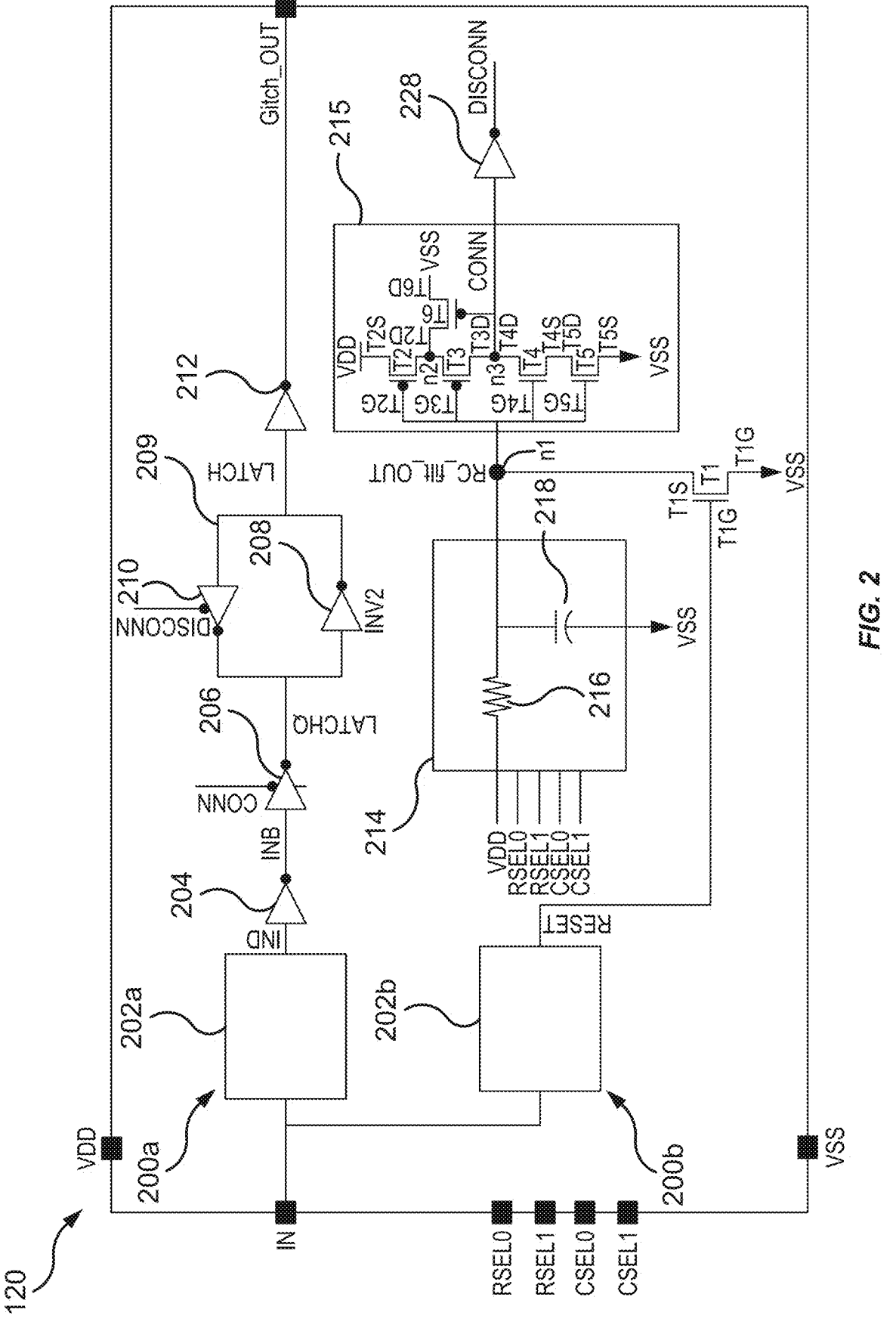
FIG. 2 illustrates a circuitry diagram of the glitch filter circuitry according to one or more examples.

FIG. 2 illustrates a circuitry diagram of the glitch filter circuitry 120 according to one or more examples. The glitch filter circuitry 120 receives an input signal IN, one or more selection signals a supply voltage VDD and a negative supply voltage VSS. In one or more examples, the selections signals may include one or more resistance selection signals, and one or more capacitance selection signals. For example, the selection signals may include, but are not limited to, a first resistance selection signal RSEL0, a second resistance selection signal RSEL1, a first capacitance selection signal CSEL0, and a second capacitance selection signal CSEL1. This will be described in more detail below.

In one or more examples, the input signal IN may be a data signal delivered from an IC device (i.e., the first IC device 102 or the second IC device 104) via the SDA line 112a to SDA pin(s) of the other IC devices of the communication system 101 (i.e., the first SDA pin 106a or the second SDA pin 106) that has been processed by the threshold level circuitry 122 disposed within the receiving IC device. On the other hand, the input signal IN may be a synchronous clock signal delivered from a master IC device (i.e., the first IC device 102) via the SCL line 114a from the first SCL pin 108a to SCL pin(s) (i.e., the second SCL pin 108b) of the slave IC device(s) of the communication system 101 (i.e., the second IC device 104) that has been processed by the threshold level circuitry 122 disposed within the receiving IC device (i.e., the second IC device 104).

As noted above, conventional noise filtering methods such as conventional RC filter circuitries, glitch filter circuitries, and Schmitt trigger circuitries alone, are not able to mitigate (e.g., suppress or at least partially suppress) all noise spikes having a pulse width than 50 ns per the I2C standard (i.e., glitches). Conventional noise filtering methods are susceptible to duty cycle distortion, false data detection, and voltage supply to ground noise that hinder the ability to filter out all noise spikes having a pulse width than 50 ns. To combat this, the glitch filter circuitry 120 includes a data path circuitry 200a and a control path circuitry 200b. The data path circuitry 200a includes a delay circuitry 202a, a inverter circuitry 204, a tri-state inverter circuitry 206, a latch circuitry 209, and a second inverter circuitry 212. The control path circuitry 200b includes a pulse generator circuitry 202b, a configurable RC filter circuitry 214, a threshold level circuitry 215, and a inverter circuitry 228. The data path circuitry 200a generates the glitch filter output signal glitch_OUT of the glitch filter circuitry 120 based on the received input signal IN and control signals generated by the control path circuitry 200b. Advantageously, by including two different paths, the configurable RC filter circuitry 214 is isolated from the data path circuitry 200a, which prevents duty cycle distortion and ensures an accurate filter output signal glitch_OUT. Stated otherwise, by isolating the configurable RC filter circuitry 214 from the data path circuitry 200a, duty cycle distortion, false data detection, and the susceptibility to voltage supply and ground noise are mitigated. Isolating the configurable RC filter circuitry 214 minimizes the RC effect and leads to an improved signal integrity and reduced signal degradation. Furthermore, the glitch filter circuitry 120 allows for filtering based on the detection of glitches.

Referring to the control path circuitry 200b, the input signal IN is provided to the pulse generator circuitry 202b. The pulse generator circuitry 202b receives the input signal IN, generates a reset signal RESET, and delivers the reset signal RESET to a transistor T1. The transistor T1 is an n-type transistor that may act as a pull-down transistor. The transistor T1 may be any suitable type of transistor such as a metal oxide semiconductor field effect transistor (MOS-FET), a bi-polar junction transistor (BJT), or the like.

In one or more examples, the pulse generator circuitry 202b generates (i.e., pulses) the reset signal RESET at each rising and falling edge of the input signal IN. The pulse width of the reset signal RESET is less than the pulse width on the input signal IN. The pulse width of the reset signal RESET may be any suitable pulse width. For example, the pulse width of the reset signal RESET may be from about 0.8 ns to about 1.2 ns, such as 1 ns.

The configurable RC filter circuitry 214 receives, the first resistance selection signal RSEL0, the second resistance selection signal RSEL1, the first capacitance selection signal CSEL0, the second capacitance selection signal CSEL1 (i.e., the one or more selection signals), a high supply voltage VDD, and a low supply voltage VSS from the controller circuitry 111. Stated otherwise, the configurable RC filter circuitry 214 includes a first input coupled to the high supply voltage VDD, a second input coupled to the first resistance selection signal RSEL0, a third input coupled to the second resistance selection signal RSEL1, a fourth input coupled to the first capacitance selection signal CSEL0, a fifth input coupled to the second capacitance selection signal CSEL1, and a sixth input coupled to the low supply voltage VSS.

Figure 4:
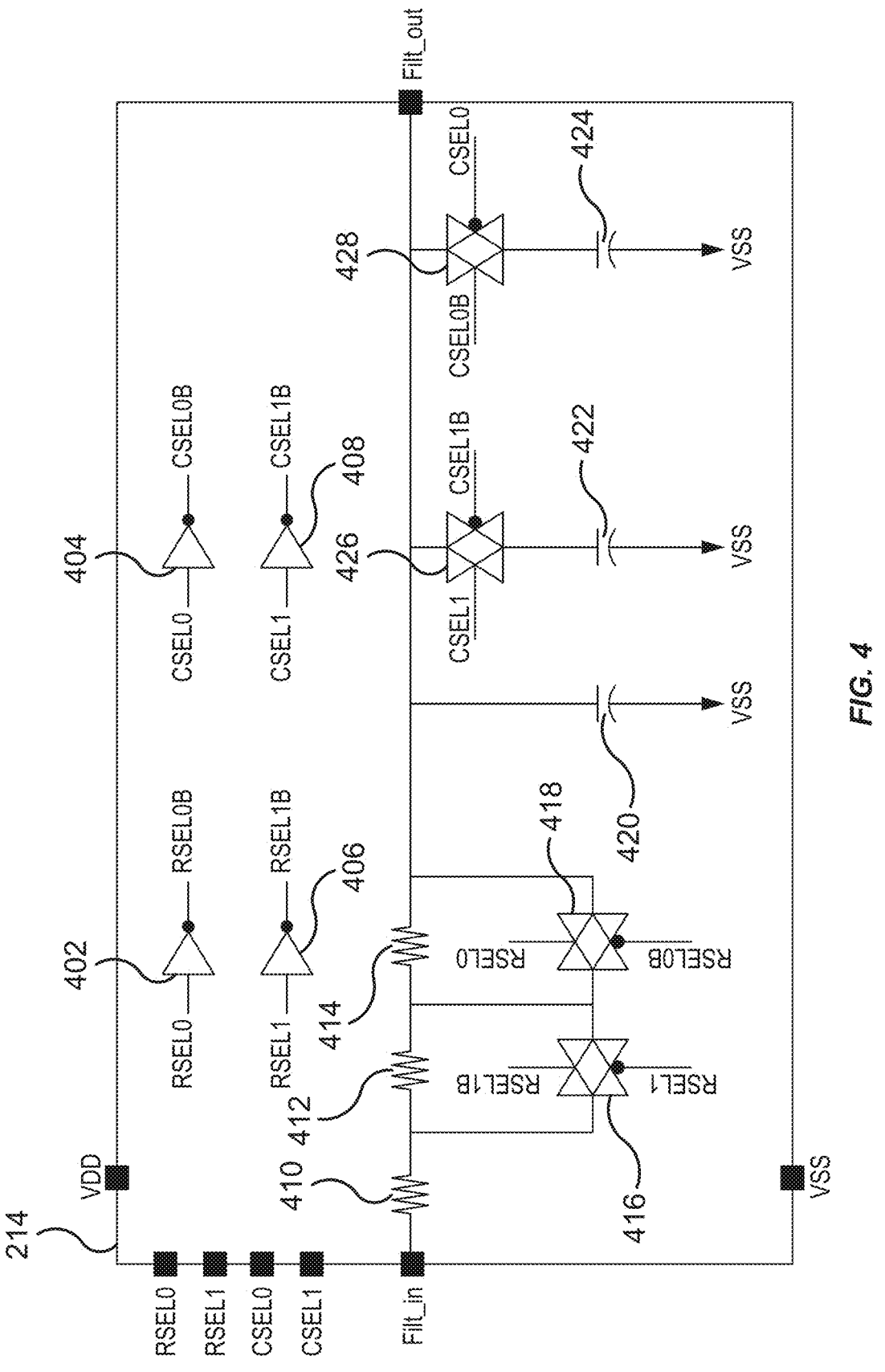
FIG. 4 illustrates a circuitry diagram of the configurable resistor capacitor (RC) filter circuitry, according to one or more examples.

The configurable RC filter circuitry 214 includes a tunable resistor 216 having a configurable resistance value (herein described as an "tunable resistance value") and a tunable capacitor 218 having a configurable capacitance value (herein defined as an "tunable capacitance value") that are coupled in-parallel. In one or more examples, the configurable RC filter circuitry 214 includes two or more resistors that are coupled in-series that can be activated/deactivated based on the first resistance selection signal RSEL0 and the second resistance selection signal RSEL1. The tunable resistance value (i.e., tunable resistor 216) is equal to the combined resistance value of the resistors that are activated. For example, the tunable resistance value may be equal to a number of activated resistors coupled in-series (FIG. 4). Stated otherwise, the resistance value may be increased or decreased using the first resistance selection signal RSEL0 and the second resistance selection signal RSEL1 based on design constraints, the width of glitches to be filtered and/or PVT variations.

The configurable RC filter circuitry 214 also includes two or more capacitors that are coupled in-parallel that can be activated/deactivated based on the first capacitance selection signal CSEL0 and the second capacitance selection signal CSEL1. The tunable capacitance value (i.e., tunable capacitor 218) is equal to the combined capacitance value of the capacitors that are activated. For example, the tunable capacitance value may be equal to a number of activated capacitors coupled in-parallel (FIG. 4). Stated otherwise, the tunable capacitance value may be increased or decreased using the first capacitance selection signal CSEL0 and the second capacitance selection signal CSEL1 based on design constraints, the desired width of glitches to be filtered, and/or PVT variations. Advantageously, the configurable RC filter circuitry 214 is more adaptable, precise, and versatile than conventional RC filters because the RC constant is variable and can be changed based on design constraints, the width of glitches to be filtered, and/or PVT variations. For example, different tunable resistance value and tunable capacitance value combinations can be used to form an RC constant that is able mitigate noise spikes (i.e., input signal IN pulses) that have a width less than a glitch pulse width. Glitches are defined herein as input signal IN pulses that have a pulse width less than or equal to the glitch pulse width. In one example, the glitch pulse width may be defined by the communication system 101 protocol. For example, the glitch pulse width may be 50 ns (i.e., I2C standard). In other examples, the glitch pulse width may be greater or less than 50 ns. For example, the glitch pulse width may be less than 50 ns, such as from about 20 ns to about 50 ns.

The glitch filter circuitry 120 is also configurable such that input signal pulses IN greater than the glitch pulse width pass (i.e., are not filtered). For example, if the glitch pulse width is 50 ns, input signal IN pulses having a pulse width greater than 50 ns pass, whereas input signal IN pulses have a pulse width less than or equal to 50 ns are filtered. The glitch pulse width is configurable by configuring the RC constant of the configurable RC filter circuitry 214 by changing the tunable resistance value and the tunable capacitance value. Therefore, the configurable RC filter circuitry 214 filters the voltage supply VDD and outputs an configurable RC filter circuitry output signal RC_filt_OUT to a node n1. Stated otherwise, the RC constant of the configurable RC filter circuitry 214 can be configured to prevent the configurable RC filter circuitry output signal RC_filt_OUT from charging to a threshold value within a length of time equal to the glitch pulse width. This will be described in more detail below.

Referring back to the reset signal RESET, the reset signal RESET is pulsed on both rising and falling edges of the input signal IN. The reset signal RESET is delivered to a gate electrode T1G of the transistor T1. Stated otherwise, the gate electrode T1G is coupled to the output of the pulse generator circuitry 202b, and therefore, receives the reset signal RESET. A source electrode T1S of the transistor T1 is also coupled to the node n1. A drain electrode T1D is also coupled to the low voltage supply VSS. The node n1 is also coupled to the threshold level circuitry 215. In one or more examples, the threshold level circuitry 215 may be a Schmitt trigger circuitry. In other examples, other types of threshold circuitries may be used. Stated otherwise, the configurable RC filter circuitry output signal RC_filt_OUT is coupled to an input of the Threshold level circuitry 215 and the source electrode T1S via the node n1.

The configurable RC filter circuitry output signal RC_filt_OUT delivered to the Threshold level circuitry 215 is based on the reset signal RESET. As noted above, the reset signal RESET is active (i.e., a pulse is generated) at each rising and falling edge of the input signal IN. Each time the reset signal RESET is active (i.e., logic level high), the transistor T1 is activated (i.e., turned "ON"). While the transistor T1 is activated, the voltage at the node n1 (the configurable RC filter circuitry output signal RC_filt_OUT) is pulled down to the low level voltage VSS. Therefore, at each rising and falling edge of the input signal IN, the transistor T1 is turned "ON" and discharges (i.e. resets) the configurable RC filter circuitry output signal RC_filt_OUT. When the reset signal RESET is inactive (i.e., logic level low) the transistor T1 is turned "OFF" and the configurable RC filter circuitry output signal RC_filt_OUT charges. Stated otherwise, the configurable RC filter circuitry output signal RC_filt_OUT (i.e., the voltage at the node n1) is discharged at each pulse of the reset signal RESET and charges between pulses of the RESET signal. As will be described in more detail below, the immediate resetting of the configurable RC filter circuitry output signal RC_filt_OUT (i.e., the signal received at the node node n1), prevents the false data detection (glitches) issues by ensuring accurate signal processing by discharging the signal received at the node n1 at every cycle of the input signal IN without letting the configurable RC filter circuitry output signal RC_filt_OUT charge build up over time.

The configurable RC filter circuitry output signal RC_filt_OUT is then delivered to the threshold level circuitry 215. The threshold level circuitry 215 includes a transistor T2, a transistor T3, a transistor T4, a transistor T5, and a transistor T6. The transistor T2, the transistor T3, and the transistor T6 are all p-type transistors. The transistor T4, and the transistor T5 are n-type transistors. The transistors T2-T6 may be any suitable type of transistor such as a metal oxide semiconductor field effect transistor (MOSFET), a bi-polar junction transistor (BJT), or the like.

A gate electrode T2G of the transistor T2, a gate electrode T3G the transistor T3, a gate electrode T4G of the transistor T4, and a gate electrode T5G of the transistor T5 are each coupled to the node n1, and therefore, receive the configurable RC filter circuitry output signal RC_filt_OUT. A source electrode T2S of the transistor is coupled to the supply voltage VDD. A drain electrode T2D of the transistor T2 is coupled to a node n2. The node n2 is further coupled to both a source electrode T3S of the transistor T3 and a source electrode T6S of the transistor T5. A drain electrode T3D of the transistor is coupled to a node n3. The node n3 is further coupled a drain electrode T4D of the transistor T4. A source electrode T4S of the transistor T4 is coupled to a drain electrode T5D of the transistor T5. A source electrode T5S of the transistor T5 and a drain electrode T6S of the transistor T5 are coupled to the low supply voltage VSS. The node n3 is further coupled to a gate electrode T6G of the transistor T5, thus forming the threshold level circuitry 215. The threshold level circuitry 215 generates (i.e., outputs) a control signal CONN from the node n3. The control signal CONN is delivered to the data path circuitry 200a and the inverter circuitry 228. The inverter circuitry 228 inverts the control signal CONN and generates an inverse control signal DISCONN that is also delivered to the data path circuitry 200a.

Referring to the data path circuitry 200a, the input signal IN is delivered to the delay circuitry 202a. The delay circuitry 202a imparts a delay onto the input signal IN and delivers a delayed input signal IND to the inverter circuitry 204. In one or more examples, the delay circuitry 202a is configured to impart a delay in a manner such that the pulses of the reset signal RESET are synchronized with the rising and falling edges of the input signal IN. The delay assists in the prevention of duty cycle distortion because it synchronizes the data path circuitry 200a with the control path circuitry 200b and ensures the glitch filter output signal glitch_OUT accurately reflects the input signal IN. In one or more examples, the delay is from about 0.8 ns to about 1.2 ns, such as 1 ns.

The inverter circuitry 204 includes an input coupled to the delay circuitry 202a and output coupled to the tri-state inverter circuitry 206. The inverter circuitry 204 inverts the delayed input signal IND and delivers an inverted input signal INB to the tri-state inverter circuitry 206.

The tri-state inverter circuitry 206 receives the inverted input signal INB from the inverter circuitry 204 and receives the control signal CONN generated by the control path circuitry 200b. The tri-state inverter circuitry 206 is activated based on the inverse of the control signal CONN. The tri-state inverter circuitry 206 generates a latch input signal LATCHQ based on the control signal CONN. For example, if the control signal CONN is logic level high, the tri-state inverter circuitry 206 is deactivated and the latch input signal LATCHQ is based on the previous value of inverted input signal INB before the control signal CONN switched to logic level high. On the other hand, if the control signal CONN is logic level low, tri-state inverter circuitry 206 inverts the inverted input signal INB and the latch input signal LATCHQ is the inverse of the inverted input signal INB (i.e., matches the original input signal IND).

The latch input signal LATCHQ is delivered from the tri-state inverter circuitry 206 to the latch circuitry 209. In one or more examples, the latch circuitry 209 includes an inverter circuitry 208 coupled to a tri-state inverter circuitry 210. The inverter circuitry 208 includes an input coupled to the output of the tri-state inverter circuitry 206 (LATCHQ) and an output coupled to an input of the tri-state inverter circuitry 210 and the second inverter circuitry 212. The tri-state inverter circuitry 210 includes inputs that are coupled to the output of the inverter circuitry 208 and the inverse control signal DISCONN, and an output coupled to the output coupled to the input of the inverter circuitry 208. The latch circuitry 209 generates and delivers an output latch signal LATCH to the second inverter circuitry 212. The latch output signal LATCH is delivered from the latch circuitry 209 to the second inverter circuitry 212.

The second inverter circuitry 212 receives the latch output signal LATCH at an input, inverts the latch output signal LATCH, and generates the glitch filter output signal glitch_OUT. The glitch filter output signal glitch_OUT is then delivered to a corresponding SCL or SDA line.

The tri-state inverter circuitry 206 is enabled based on the inverse of the control signal CONN, and the tri-state inverter circuitry 210 is activated based on the inverse of the inverse control signal DISCONN. The tri-state inverter circuitry 206 and the tri-state inverter circuitry 210 cannot be activated at the same time. For example, if the control signal CONN is logic level high and the inverse control signal DISCONN is logic level low (or vice versa), the tri-state inverter circuitry 206 is deactivated and the tri-state inverter circuitry 210 is activated. Therefore, as will be described in more detail below, the glitch filter output signal glitch_OUT maintains its previous state (or vice versa). On the other hand, if the control signal CONN is logic level low and the inverse control signal DISCONN is logic level high (or vice versa), the tri-state inverter circuitry 206 is activated and the tri-state inverter circuitry 210 is deactivated. Therefore, the input signal IN traverses an inverter circuitry chain (i.e., the inverter circuitry 204, the tri-state inverter circuitry 206, the inverter circuitry 208, and the second inverter circuitry 212). Stated otherwise, the glitch filter output signal glitch_OUT follows the value (i.e., the logic level) of the input signal IN. In other examples, the second inverter circuitry may be omitted and the output signal (when following the inverter circuitry chain) is the inverse of the input signal IN. Stated otherwise, when there are no glitches present on the input signal IN, filtering is not performed. Advantageously, this allows for the control path circuitry 200b to be selected for filtering when glitches are detected because the tri-state inverter circuitry 210 is bypassed when glitches are not present on the input signal IN.

Advantageously, based on the control signal CONN, the glitch filter circuitry 120 is able to detect when glitches are present and filter them. The glitch filter circuitry 120 combines precise reset signal generation, delay management, and strategic control signals that effectively suppresses glitches and unwanted noise, enhancing overall circuit reliability. Furthermore, by managing the configurable RC filter circuitry output signal RC_filt_OUT and signal manipulation, the glitch filter circuitry 120 guarantees a rail-to-rail swing at the output which contributes to maintaining signal integrity and accurate data representation.

Figure 3:
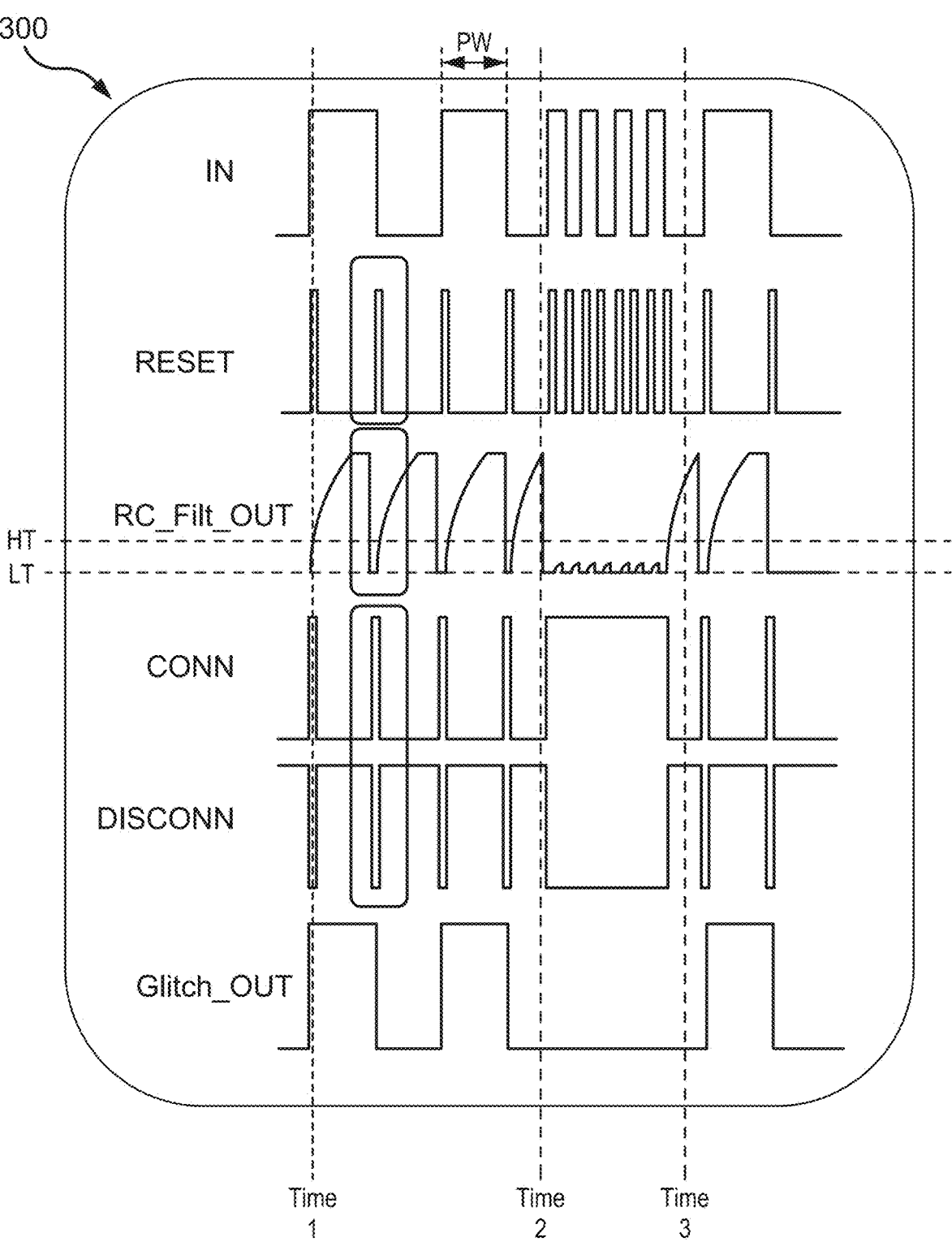
FIG. 3 illustrates a waveform diagram illustrating the operation of the glitch filter circuitry 120, according to one or more examples.

FIG. 3 illustrates a waveform diagram 300 illustrating the operation of the glitch filter circuitry 120, according to one or more examples. The waveform diagram 300 illustrates the input signal IN waveform and resulting signal waveforms generated by the glitch filter circuitry 120. Stated otherwise, the waveform diagram 300 illustrates the reset signal RESET waveform, configurable RC filter circuitry output signal RC_filt_OUT waveform, the control signal CONN waveform, the inverse control signal DISCONN waveform, and the glitch filter output signal glitch_OUT waveform with respect to each other.

A first time period that takes place between a first time Time1 and a second time Time2. During the first time period, glitches do not occur. The pulse width Pw of each pulse of the input signal IN waveform between the first time Time1 and the second time Time2 are greater than a glitch pulse width and therefore no glitches occur.

As described above, as the glitch filter circuitry 120 receives the input signal IN, the pulse generator circuitry 202b generates the reset signal RESET. The reset signal RESET is delivered (i.e., pulses) at each rising edge and falling edge of the input signal IN. Thus, the reset signal RESET waveform has a shorter pulse width than the pulse width Pw. The RC constant of the configurable RC filter circuitry 214 is generated based on the received first resistance selection signal RSEL0, the second resistance selection signal RSEL1, the first capacitance selection signal CSEL0, the second capacitance selection signal CSEL1. As the input signal IN waveform is received, the configurable RC filter circuitry 214 filters the high supply voltage signal VDD and outputs configurable RC filter circuitry output signal RC_filt_OUT waveform based on a charge rate. The charge rate as defined herein refers to the time it takes for configurable RC filter circuitry output signal RC_filt_OUT waveform to charge from logic level low to logic level high (or vice versa). The charge rate is configurable based on the tunable resistance value and tunable capacitance value of the configurable RC filter circuitry 214. This will be described in more detail below.

Also as noted above, the reset signal RESET waveform is provided to the transistor T1 at every rising and falling edge of the input signal IN. Therefore, at every rising edge and falling edge of the input signal IN waveform (i.e., each pulse of the reset signal RESET), configurable RC filter circuitry output signal RC_filt_OUT waveform discharges. Therefore, at each pulse of the reset signal RESET, configurable RC filter circuitry output signal RC_filt_OUT waveform resets to logic level low, and between each pulse of the reset signal RESET, the configurable RC filter circuitry output signal RC_filt_OUT waveform charges. Stated otherwise, at each pulse of the reset signal RESET, the configurable RC filter circuitry 214 needs to recharge.

Configurable RC filter circuitry output signal RC_filt_OUT waveform is provided to the threshold level circuitry 215. The threshold level circuitry 215 outputs the control signal CONN waveform. The control signal CONN waveform only changes state when configurable RC filter circuitry output signal RC_filt_OUT waveform crosses either below a low threshold voltage LT or above a high threshold voltage HT. For example, each time configurable RC filter circuitry output signal RC_filt_OUT waveform is reset, it falls below the low threshold voltage LT, and the control signal CONN waveform switches from a first logic level to a second logic level. Then, the control signal CONN waveform will maintain the second logic level until the high threshold voltage HT is surpassed. The control signal CONN waveform will only switch back to the first logic level once the configurable RC filter circuitry output signal RC_filt_OUT reaches the high threshold voltage HT. For example, as illustrated between the first time Time1 and the second time Time2, at each rising edge and falling edge of the input signal waveform IN, the reset signal RESET discharges the configurable RC filter circuitry output signal RC_filt_OUT waveform causing the configurable RC filter circuitry output signal RC_filt_OUT waveform to fall below the low threshold voltage LT (after the high threshold voltage HT was reached) and the control signal CONN waveform to switch to logic level high (or vice versa). Next, because during the first time period, the pulse width Pw of the input signal is greater than the glitch pulse width, there is a duration of time between the pulses of the reset signal RESET waveform that allows the configurable RC filter circuitry output signal RC_filt_OUT waveform to charge past the high threshold voltage HT. Once the configurable RC filter circuitry output signal RC_filt_OUT waveform charges past the high threshold voltage HT, the control signal CONN waveform switches back to logic level low (or vice versa).

As noted above, the inverse control signal DISCONN is the inverse of the control signal CONN waveform and therefore, the control signal CONN waveform and the inverse control signal DISCONN waveform are inverse to one another.

When the control signal CONN waveform is logic level low, the tri-state inverter circuitry 206 is enabled and the tri-state inverter circuitry 210 is disabled, which allows the input signal IN to follow the path of inverter circuitries which causes the glitch output waveform glitch_OUT to follow the state of the input signal IN waveform. Therefore, during normal operation, when no glitches are detected, after each reset signal RESET pulse, the configurable RC filter circuitry output signal RC_filt_OUT waveform is able to charge past the high threshold voltage HT, causing the control signal CONN waveform to switch from logic level high to logic level low and causes the glitch filter output signal glitch_OUT waveform to change state (i.e., follow) based on the state of the input signal IN waveform.

During a second time period, between the second time Time2 and a third time Time3, the input signal is glitching. Stated otherwise, the pulse width Pw of the input signal IN waveform shrinks to a width less than the glitch pulse width. As the pulse generator circuitry 202b delivers a reset signal at each rising edge and falling edge of each pulse, the frequency of the reset signal RESET waveform is increased. The charge time between reset signal RESET waveform pulses decreases. Advantageously, because the RC constant of the configurable RC filter circuitry 214 is configurable, the RC constant is specifically set to configure a charge rate that prevents the configurable RC filter circuitry output signal RC_filt_OUT from charging to the high threshold voltage HT within the time provided by the glitch pulse width. Stated otherwise, the control signal CONN waveform value remains constant during the second time period because the configurable RC filter circuitry output signal RC_filt_OUT never reaches the high threshold voltage HT before resetting. The pulse generator circuitry 202b is generating reset pulses at a faster rate due to the decreased pulse width of the input waveform. Advantageously, this causes the glitches to be filtered out. When the control signal CONN waveform is logic level high, the tri-state inverter circuitry 206 is disabled and the latch circuitry 209 is enabled, which causes the glitch filter output signal glitch_OUT waveform to maintain the previous state. Therefore, the glitch filter output signal glitch_OUT waveform is unaffected by the glitches because the latch circuitry 209 is activated the entire time.

FIG. 4 illustrates a circuitry diagram of the configurable resistor capacitor (RC) filter circuitry 214, according to one or more examples. In one or more examples, the configurable RC filter circuitry 214 receives, the first resistance selection signal RSEL0, the second resistance selection signal RSEL1, the first capacitance selection signal CSEL0, the second capacitance selection signal CSEL1, a high supply voltage VDD, and a low supply voltage VSS. Stated otherwise, the configurable RC filter circuitry 214 includes a first input coupled to the high supply voltage VDD, a second input coupled to the first resistance selection signal RSEL0, a third input coupled to the second resistance selection signal RSEL1, a fourth input coupled to the first capacitance selection signal CSEL0, a fifth input coupled to the second capacitance selection signal CSEL1, and a sixth input coupled to the low supply voltage VSS.

The configurable RC filter circuitry 214 includes a inverter circuitry 402, a inverter circuitry 404, a inverter circuitry 406, an inverter circuitry 408, a resistor 410, a resistor 412, a resistor 414, a capacitor 420, a capacitor 422, a capacitor 424, a transmission gate circuitry 416, a transmission gate circuitry 418, a transmission gate circuitry 426, and a transmission gate circuitry 428.

In one or more examples, the inverter circuitry 402 receives the first resistance selection signal RSEL0 and outputs an inverted first resistance selection signal RSEL0B. The inverter circuitry 406 receives the second resistance selection signal RSEL1 and outputs an inverted second resistance selection signal RSEL1B. The inverter circuitry 404 receives the first capacitance selection signal CSEL0 and outputs an inverted first capacitance selection signal CSEL0B. The inverter circuitry 408 receives the second capacitance selection signal CSEL1 and outputs an inverted second capacitance selection signal CSEL1B.

The resistor 410, resistor 412, and resistor 414 are coupled in-series. The resistor 410, resistor 412, and resistor 414 can be combined to form the tunable resistor 216 (i.e., the tunable resistance value). The resistor 412 is coupled in-parallel to the transmission gate circuitry 416. The resistor 414 is coupled in-parallel to the transmission gate circuitry 418. In one or more examples, the tunable resistance value is configured based on whether the resistor 412 and/or the resistor 414 are activated. The resistor 412 is activated based on whether the transmission gate circuitry 416 is activated. The resistor 414 is activated based on whether the transmission gate circuitry 418 is activated. Stated otherwise, the tunable resistance value is equal to the sum of the resistance values of the resistor 410 plus the resistor 412 and/or the resistor 414.

The transmission gate circuitry 416 receives the second resistance selection signal RSEL1 and the inverse second resistance selection signal RSEL1B at control inputs, and the high voltage signal VDD at the data input. A second resistance value ($R_2$) of the resistor 412 is added to the tunable resistance value (tunable resistor 216) based on the inverse of the second resistance selection signal RSEL1 and the inverse second resistance selection signal RSEL1B. For example, if the second resistance selection signal RSEL1 is logic level high, both the inverse of the second resistance selection signal RSEL1 and the inverse second resistance selection signal RSEL1B are logic level low, and there is a high impedance through the transmission gate circuitry 416 (i.e., the transmission gate circuitry 416 is deactivated). Because signals take the path of least resistance, the high voltage signal VDD will take the path of least resistance and pass through the resistor 412 adding the second resistance value ($R_2$) to the tunable resistance value. On the other hand, if the second resistance selection signal RSEL1 is logic level low, the inverse of the second resistance selection signal RSEL1 and the inverse second resistance selection signal RSEL1B are both logic level high, the transmission gate circuitry 416 is activated, and the voltage signal VDD takes the path of least resistance and bypasses the resistor 412.

The transmission gate circuitry 418 receives the first resistance selection signal RSEL0 and the inverse first resistance selection signal RSEL0B at control inputs. A third resistance value ($R_3$) of the resistor 414 is added to the tunable resistance value (tunable resistor 216) based on the first resistance selection signal RSEL0 and the inverse of the inverse first resistance selection signal RSEL0B. For example, if the first resistance selection signal RSEL0 is logic level low, the inverse of the inverse first resistance selection signal RSEL0B is also logic level low, and there is a high impedance through the transmission gate circuitry 418 (i.e., the transmission gate circuitry 418 is deactivated). Because signals take the path of least resistance, the high voltage signal VDD will take the path of least resistance and pass through the resistor 414 adding the third resistance value ($R_3$) to the tunable resistance value. On the other hand, if the first resistance selection signal RSEL0 is logic level high, the first resistance selection signal RSEL0 and the inverse of the inverse first resistance selection signal RSEL0B are also logic level high, the transmission gate circuitry 418 is activated, and the voltage signal VDD takes the path of least resistance and bypasses the resistor 414.

On the other hand, because the resistor 410 is directly coupled to the voltage supply VDD the tunable resistance value always includes a first resistance value ($R_1$) of the resistor 410. In one or more examples, the first resistance value ($R_1$), second resistance value ($R_2$), and third resistance value ($R_3$) may be equal or unequal.

Advantageously, as described above, the tunable resistance value (i.e., the resistance value of tunable resistor 216) is configurable based on the first resistance selection signal RSEL0 and the second resistance selection signal RSEL1. The tunable resistance value can be configured to be any combination of the sum between the first resistance value ($R_1$), and second resistance value ($R_2$) and/or third resistance value ($R_3$). Stated otherwise, the tunable resistance value can be precisely controlled using the first resistance selection signal RSEL0 and the second resistance selection signal RSEL1. As illustrated in Table 1 below, based on the first resistance selection signal RSEL0 and the second resistance selection signal RSEL1, the tunable resistance value can be dynamically changed (i.e., increased or decreased) based on the desired glitch pulse width, design constraints, and/or PVT variations of passive elements in a circuit design.

Referring to Table 1, if the first resistance selection signal RSEL0 and the second resistance selection signal RSEL1 are both logic level low (i.e., "0"), the transmission gate circuitry 416 is activated, there is a high impedance through the transmission gate circuitry 418, and therefore, the tunable resistance value is equal to the sum of the first resistance value ($R_1$) and the third resistance value ($R_3$). If the first resistance selection signal RSEL0 is logic level low and the second resistance selection signal RSEL1 is logic level high (i.e., "1"), the transmission gate circuitry 416 and the transmission gate circuitry 418 have a high impedance, and the tunable resistance value is the sum of all three resistance values. If the first resistance selection signal RSEL0 is logic level high and the second resistance selection signal RSEL1 is logic level low (i.e., "1"), the transmission gate circuitry 416 and the second transmission gate circuitry 418 are activated, and the tunable resistance value is the first resistance value ($R_1$). If the first resistance selection signal RSEL0 and the second resistance selection signal RSEL1 are both logic level high, there is a high impedance through the transmission gate circuitry 416, the transmission gate circuitry 418 is activated, and therefore, the tunable resistance value is equal to the sum of the first resistance value ($R_1$) and the second resistance value ($R_2$).

TABLE 1

| RSEL0 | RSEL1 | Equivalent resistance value |
|---|---|---|
| 0 | 0 | $R_1 + R_3$ |
| 0 | 1 | $R_1 + R_2 + R_3$ |
| 1 | 0 | $R_1$ |
| 1 | 1 | $R_1 + R_2$ |

In one or more examples, the second resistance value ($R_2$) and the third resistance value ($R_3$) are equal, and the resistance selection signals are initialized to both be logic level low (or vice versa). Therefore, the initial (i.e., default) tunable resistance value is the sum of the first resistance value ($R_1$) and the third resistance value ($R_3$) (or vice versa). The tunable resistance value can be increased or decreased dynamically by changing the values of the resistance selection signals. For example, the second resistance selection signal RSEL1 can be changed to logic level high and increase the tunable resistance value by activating the resistor 412. The first resistance selection signal RSEL0 can be changed to logic level high and decrease the tunable resistance value by deactivating the resistor 414. Because the second and third resistors have equal resistance values, setting both resistance selection signals to logic level high would be a redundant operation, and the tunable resistance value would not change. On the other hand, the second resistance value ($R_2$) and the third resistance value ($R_3$) may be different and the combinations of resistance signals may be changed to increase/decrease the tunable resistance value between unique resistance values. In other examples, the resistance selection signals may be initialized to any combination of logic levels.

The capacitor 420, capacitor 422, and capacitor 424 are coupled in-parallel. The capacitor 420, capacitor 422, and capacitor 424 can be combined to form the tunable capacitor 218 (i.e., the tunable capacitance value). The capacitor 422 is coupled in-series to the transmission gate circuitry 426. The capacitor 424 is coupled in-series to the transmission gate circuitry 428. In one or more examples, the tunable capacitance value is configured based on whether the capacitor 422 and/or the capacitor 424 are activated. The capacitor 422 is activated based on whether the transmission gate circuitry 426 is activated. The capacitor 424 is activated based on whether the transmission gate circuitry 428 is activated. Stated otherwise, the tunable capacitance value is equal to the sum of the capacitance values of the capacitor 420 plus the capacitor 422 and/or the capacitor 424.

The transmission gate circuitry 426 receives the second capacitance selection signal CSEL1 and the inverse second capacitance selection signal CSEL1B at control inputs, and the high voltage signal VDD at the data input. A second capacitance value ($C_2$) of the capacitor 422 is added to the tunable capacitance value (tunable capacitor 218) based on the second capacitance selection signal CSEL1 and the inverse of the inverse second capacitance selection signal CSEL1B. For example, if the second capacitance selection signal CSEL1 is logic level low, the inverse of the inverse second capacitance selection signal CSEL1B is also logic level low, and there is a high impedance through the transmission gate circuitry 426 (i.e., the transmission gate circuitry 426 is deactivated). Because signals take the path of least resistance, the high voltage signal VDD will take the path of least resistance and bypass the capacitor 422. On the other hand, if the second capacitance selection signal CSEL1 is logic level high, the inverse of the inverse second capacitance selection signal CSEL1B is also logic level high, the transmission gate circuitry 426 is activated, adding the second capacitance value ($C_2$) to the tunable capacitance value.

The transmission gate circuitry 428 receives the first capacitance selection signal CSEL0 and the inverse first capacitance selection signal CSEL0B at control inputs. A third capacitance value ($C_3$) of the capacitor 424 is added to the tunable capacitance value (tunable capacitor 218) based on the inverse of the first capacitance selection signal CSEL0 and the inverse first capacitance selection signal CSEL0B. For example, if the first capacitance selection signal CSEL0 is logic level high, the inverse of the first capacitance selection signal CSEL0 and the inverse first capacitance selection signal CSEL0B is are logic level low, and there is a high impedance through the transmission gate circuitry 428. Because signals take the path of least resistance, the high voltage signal VDD will take the path of least resistance and bypass the capacitor 424 (i.e., the transmission gate circuitry 428 is deactivated). On the other hand, if the first capacitance selection signal CSEL0 is logic level low, the inverse of the first capacitance selection signal CSEL0 and the inverse first capacitance selection signal CSEL0B are logic level high, the transmission gate circuitry 428 is activated, adding the third capacitance value ($C_3$) to the tunable capacitance value.

On the other hand, because the capacitor 420 is not directly coupled to a transmission gate the tunable capacitance value always includes a first capacitance value (C1) of the capacitor 420. In one or more examples, the first capacitance value (C1), second capacitance value (C2), and third capacitance value (C3) may be equal or unequal.

Advantageously, as described above, the tunable capacitance value (i.e., the capacitance value of the tunable capacitor 218) is configurable based on the first capacitance selection signal CSEL0 and the second capacitance selection signal CSEL1. The tunable capacitance value can be configured to be any combination of the sum between the first capacitance value ($C_1$) plus the second capacitance value ($C_2$) and/or third capacitance value ($C_3$). Stated otherwise, there tunable capacitance value can be precisely controlled using the first capacitance selection signal CSEL0 and the second capacitance selection signal CSEL1. As illustrated in Table 2 below, based on the first capacitance selection signal CSEL0 and the second capacitance selection signal CSEL1, the tunable capacitance value can be dynamically changed (i.e., increased or decreased) based on the desired glitch pulse width, design constraints, and/or PVT variations of passive elements in the circuit design.

Referring to Table 2, if the first capacitance selection signal CSEL0 and the second capacitance selection signal CSEL1 are both logic level low (i.e., "0"), there is a high impedance through the transmission gate circuitry 426, the transmission gate circuitry 428 is activated, and therefore, the tunable capacitance value is equal to the sum of the first capacitance value ($C_1$) and the third capacitance value ($C_3$). If the first capacitance selection signal CSEL0 is logic level low and the second capacitance selection signal CSEL1 is logic level high (i.e., "1"), the transmission gate circuitry 426 and the transmission gate circuitry 428 are activated and the tunable capacitance value is the sum of all three capacitance values. If the first capacitance selection signal CSEL0 is logic level high and the second capacitance selection signal CSEL1 is logic level low (i.e., "1"), there is a high impedance through the transmission gate circuitry 426 and through the transmission gate circuitry 428 and the tunable capacitance value is the first capacitance value ($C_1$). If the first capacitance selection signal CSEL0 and the second capacitance selection signal CSEL1 are both logic level high, there is a high impedance through the transmission gate circuitry 428, the transmission gate circuitry 426 is activated, and therefore, the tunable capacitance value is equal to the sum of the first capacitance value ($C_1$) and the second capacitance value ($C_2$).

TABLE 2

| CSEL0 | CSEL1 | Equivalent Capacitance Value |
|---|---|---|
| 0 | 0 | $C_1 + C_3$ |
| 0 | 1 | $C_1 + C_2 + C_3$ |
| 1 | 0 | $C_1$ |
| 1 | 1 | $C_1 + C_2$ |

In one or more examples, the second capacitance value ($C_2$) and the third capacitance value (C) are equal, and the capacitance selection signals are initialized to both be logic level low (or vice versa). Therefore, the initial (i.e., default) tunable capacitance value is the sum of the first capacitance value ($C_1$) and the third capacitance value ($C_3$) (or vice versa). The tunable capacitance value can be increased or decreased dynamically by changing the values of the capacitance selection signals. For example, the second capacitance selection signal CSEL1 can be changed to logic level high and increase the tunable capacitance value by activating the capacitor 422. The first capacitance selection signal CSEL0 can be changed to logic level high and decrease the tunable capacitance value by deactivating the capacitor 424. Because the second and third capacitors have equal resistance values, setting both capacitance selection signals to logic level high would be a redundant operation and the tunable capacitance value would not change. On the other hand, the second capacitance value ($C_2$) and the third capacitance value ($C_3$) may be different, and the combinations of capacitance signals may be changed to increase/decrease the tunable capacitance value between unique capacitance values. In other examples, the capacitance selection signals may be initialized to any combination of logic levels.

Although the configurable RC filter circuitry 214 includes three resistors controlled by two resistance selection signals and three capacitors controlled by two capacitance selection signals this is for example purposes only. Any suitable quantity selection signals (i.e., resistance selection signals and capacitance selection signals) resistors, and capacitors. For example, the quantity of resistance selection signals may be equal to x minus 1, where x is the quantity of resistors. The quantity of capacitance selection signals may be equal to y minus 1 where y is the quantity of capacitors. For example, 4 resistors would correspond to 3 resistor selection signals, and 4 capacitors would corresponding to 3 selection signals. The values of x and y may be the same or different. Stated otherwise, the quantity of resistance selection signals and capacitance selection signals received by the configurable RC filter circuitry 214 is not limited.

Figure 5:
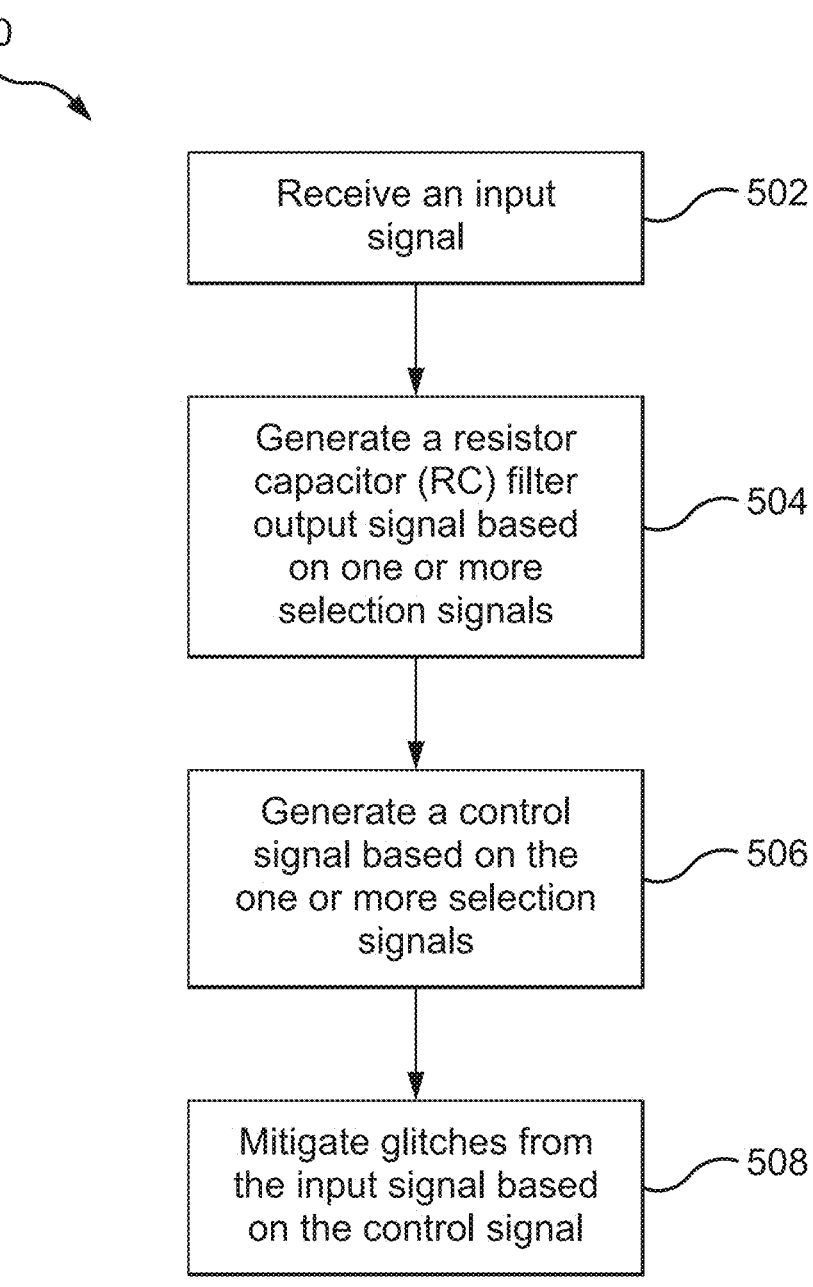
FIG. 5 illustrates a flow diagram of a method 500 for mitigating glitches of an input signal according to one or more examples.

FIG. 5 illustrates a flow diagram of a method 500 for mitigating glitches of an input signal according to one or more examples.

At operation 502, of the method 500, the control path circuitry 200*b* of the glitch filter circuitry 120 receives the input signal IN. As described in FIGS. 2-4 above, the pulse generator circuitry 202*b* of the control path circuitry 200*b* generates the reset signal RESET based on the input signal IN. The reset signal RESET, is then delivered by the pulse generator circuitry 202*b* to the transistor T1.

At operation 504 of the method 500, the configurable RC filter circuitry 214 generates the configurable RC filter circuitry output signal RC_filt_OUT based on one or more selection signals delivered from the controller circuitry 211 to the configurable RC filter circuitry 214, as described in FIGS. 2-4 above. As noted above, the one or more selection signals include, but are not limited, to the first resistance selection signal RSEL0, the second resistance selection signal RSEL1, a first capacitance selection signal CSEL0, and the second capacitance selection signal CSEL1. The configurable RC filter circuitry 214 has a charge time based on the one or more selection signals. Stated otherwise, the tunable resistance and tunable capacitance are configured by the one or more selection signals based on the glitch pulse width. The tunable resistance and tunable capacitance are tuned so that the configurable RC filter circuitry output signal RC_filt_OUT is not able to charge (i.e., reach) the high threshold voltage value HT when the pulse width Pw of the input signal IN is less than the glitch pulse width (FIG. 3). The tunable resistance and tunable capacitance are tuned in the manner described in FIG. 4 above. By preventing the configurable RC filter circuitry output signal RC_filt_OUT from reaching the high threshold voltage value HT, the Threshold level circuitry 15 is prevented from changing the value of the control signal CONN when glitches are detected.

At operation 506 of the method 500, the control signal CONN is generated by the control path circuitry 200*b*. The control signal CONN is generated by the Threshold level circuitry 15 and is based on the configurable RC filter circuitry output signal RC_filt_OUT. The control signal CONN is generated in the same manner described above in FIGS. 2-4. As noted above, the configurable RC filter circuitry output signal RC_filt_OUT is prevented from reaching the high threshold voltage value HT of the Threshold level circuitry 15 when glitches are detected. Stated otherwise the control signal CONN remains unaffected when glitches are detected.

At operation 508 of the method 500, glitches within the input signal are mitigated (i.e., filtered) by the data path circuitry 200*a*. Stated otherwise, when pulses of the input signal IN have a pulse width Pw less than the glitch pulse width, the data path circuitry 200*a* mitigates the glitches based on the control signal in the same manner described above in FIGS. 2-4. Stated otherwise, because the control signal CONN is unaffected when glitches are detected, the glitch filter output signal glitch_OUT, will also be unaffected by the glitches.

Advantageously, the capacitance and resistance selection signals can be independently dynamically changed, allowing for the RC constant to be dynamically changed. Therefore, the RC constant of the configurable RC filter circuitry 214 can be dynamically changed based on PVT variations between passive circuitry elements on across different IC devices, the desired glitch pulse width to be filtered, or the like. Stated otherwise, the RC constant may be fined tuned, and therefore optimized, to cater to glitch pulse widths that exceed synchronous communication system standards bolstering the versatility and adaptability of the configurable RC filter circuitry 214 and allowing for catering to various environmental conditions, thus ensuring accurate signal processing.

While the foregoing is directed to specific examples, other and further examples may be devised without departing from the basic scope thereof, and the scope thereof is determined by the claims that follow.

What is claimed is:

1. A computing system comprising:
   a first integrated circuit (IC) device;
   a second IC device connected to the first IC device, wherein the second IC device comprises a glitch filter circuitry configured to receive an input signal from the first IC device and provide a glitch filter output signal based on the input signal, the glitch filter circuitry comprising:
   a control path circuitry configured to receive the input signal and generate a control signal based on detecting a glitch within the input signal, the control path circuitry comprising:
     a configurable resistor capacitor (RC) filter circuitry configured to deliver a configurable RC filter circuitry output signal based on one or more selection signals, wherein the control signal is based on the configurable RC filter circuitry output signal; and
     a pulse generator circuitry configured to receive the input signal and deliver a reset signal to a transistor at each rising and falling edge of the input signal, wherein the transistor is configured to discharge the configurable RC filter circuitry output signal based on the reset signal; and
   a data path circuitry configured to receive the control signal and mitigate glitches within the input signal based on the control signal.

2. The computing system of claim 1, wherein the reset signal has a shorter pulse width than a pulse width of the input signal.

3. The computing system of claim 1, wherein the data path circuitry further comprises:
   a delay circuitry configured to receive the input signal and generate a delayed input signal;
   a first inverter circuitry configured to receive the delayed input signal and generate an inverted input signal; and
   a first tri-state inverter circuitry configured to receive the delayed input signal and the control signal and generate a latch input signal based on the control signal, wherein the first tri-state inverter circuitry is configured to invert the delayed input signal if the control signal activates the first tri-state inverter circuitry or generate a previous value of the delayed input signal if the control signal deactivates the first tri-state inverter circuitry.

4. The computing system of claim 3, wherein the data path circuitry further comprises:
   a latch circuitry coupled to the first tri-state inverter circuitry, the latch circuitry configured to receive the latch input signal and an inverse of the control signal and generative an output latch signal, the latch circuitry comprising a second inverter circuitry coupled to a second tri-state inverter circuitry, wherein the second tri-state inverter circuitry is activated or deactivated based on the inverse of the control signal; and
   a third inverter circuitry configured to receive the output latch signal and generate the glitch filter output signal, wherein the glitch filter output signal is configured to match the input signal when a pulse width of the input signal is greater than a glitch pulse width.

5. The computing system of claim 1, wherein the configurable RC filter circuitry comprises a tunable resistor having a tunable resistance value coupled in-parallel to a tunable capacitor having a tunable capacitance value.

6. The computing system of claim 5, wherein the configurable RC filter circuitry comprises:

a first resistor and a second resistor coupled in-series, wherein the tunable resistance value of the tunable resistor is based on whether the second resistor if activated or deactivated.

7. The computing system of claim 5, wherein the configurable RC filter circuitry comprises:

a first capacitor, and a second capacitor coupled in-parallel, wherein the tunable capacitance value of the tunable capacitor is based on whether the second capacitor is activated or deactivated.

8. A glitch filter circuitry comprising:

a control path circuitry configured to receive an input signal and generate a control signal based on detecting a glitch within the input signal, the control path circuitry comprising:

a configurable resistor capacitor (RC) filter circuitry configured to deliver an configurable RC filter circuitry output signal based on one or more selection signals, wherein the control signal is based on the configurable RC filter circuitry output signal; and a pulse generator circuitry configured to receive the input signal and deliver a reset signal to a transistor at each rising and falling edge of the input signal, wherein the transistor is configured to discharge the configurable RC filter circuitry output signal based on the reset signal; and a data path circuitry configured to receive the control signal and mitigate glitches within the input signal based on the control signal.

9. The glitch filter circuitry of claim 8, wherein the reset signal has a shorter pulse width than a pulse width of the input signal.

10. The glitch filter circuitry of claim 8, wherein the data path circuitry comprises:

a delay circuitry configured to receive the input signal and generate a delayed input signal;

a first inverter circuitry configured to receive the delayed input signal and generate an inverted input signal; and a first tri-state inverter circuitry configured to receive the delayed input signal and the control signal and generate a latch input signal based on the control signal, wherein the first tri-state inverter circuitry is configured to invert the delayed input signal if the control signal activates the first tri-state inverter circuitry or generate a previous value of the delayed input signal if the control signal deactivates the first tri-state inverter circuitry.

11. The glitch filter circuitry of claim 10, wherein the data path circuitry further comprises:

a latch circuitry coupled to the first tri-state inverter circuitry, the latch circuitry configured to receive the latch input signal and an inverse of the control signal and generative an output latch signal, the latch circuitry comprising second inverter circuitry coupled to a second tri-state inverter circuitry, wherein the second tri-state inverter circuitry is activated or deactivated based on the inverse of the control signal; and a third inverter circuitry configured to receive the output latch signal and generate a glitch filter output signal, wherein the glitch filter output signal is configured to match the input signal when a pulse width of the input signal is greater than a glitch pulse width.

12. The glitch filter circuitry of claim 10, wherein the configurable RC filter circuitry comprises an tunable resistor having a tunable resistance value coupled in-parallel to a tunable capacitor having a tunable capacitance value.

13. The glitch filter circuitry of claim 12, wherein the configurable RC filter circuitry comprises:

a first resistor and a second resistor coupled in-series, wherein the tunable resistance value of the tunable resistor is based on whether the second resistor is activated or deactivated.

14. The glitch filter circuitry of claim 12, wherein the configurable RC filter circuitry comprises:

a first capacitor and a second capacitor coupled in-parallel, wherein the tunable capacitance value of the tunable capacitor is based on whether the second capacitor is activated or deactivated.

15. A method comprising:

receiving, by a control path circuitry of a glitch filter circuitry of an integrated circuit (IC) device of a communication system, an input signal;

generating, by a configurable resistor capacitor (RC) filter circuitry of the control path circuitry, a configurable RC filter circuitry output signal, wherein the configurable RC filter circuitry output signal is based on one or more selection signals received by the configurable RC filter circuitry;

delivering, by a pulse generator circuitry of the control path circuitry, a reset signal based on the input signal to a transistor at each rising and falling edge of the input signal, wherein the transistor is configured to discharge the configurable RC filter circuitry output signal based on the reset signal;

generating, by the control path circuitry, a control signal based on the configurable RC filter circuitry output signal; and mitigating, by a data path circuitry, glitches within the input signal based on the control signal.

16. The method of claim 15, wherein the reset signal has a shorter pulse width than a pulse width of the input signal.

17. The method of claim 15, further comprising receiving, by a delay circuitry of the data path circuitry, the input signal;

delivering, by the delay circuitry, a delayed input signal to a first inverter circuitry of the data path circuitry;

delivering, by the first inverter circuitry, an inverted input signal to a first tri-state inverter circuitry of the data path circuitry based on the delayed input signal; and generating, by the first tri-state inverter circuitry, a latch input signal based on the control signal, wherein the first tri-state inverter circuitry is configured to invert the delayed input signal if the control signal activates the first tri-state inverter circuitry or generate a previous value of the delayed input signal if the control signal deactivates the first tri-state inverter circuitry.

18. The method of claim 17, further comprising receiving, by a latch circuitry of the data path circuitry, the latch input signal and an inverse of the control signal, wherein the latch circuitry comprises a second inverter circuitry coupled to a second tri-state inverter circuitry that is activated or deactivated based on the inverse of the control signal;

delivering, by the latch circuitry, an output latch signal to a third inverter circuitry of the data path circuitry wherein the output latch signal is based on whether the second tri-state inverter circuitry is activated or deactivated; and generating, by the third inverter circuitry, a glitch filter output signal, wherein the glitch filter output signal is configured to match the input signal when a pulse width of the input signal is greater than a glitch pulse width.

19. The method of claim 15, further comprising:

tuning a tunable resistance value of a tunable resistor of the configurable RC filter circuitry based on one or more resistance selection signals received by the configurable RC filter circuitry, wherein the tunable resistor comprises a first resistor coupled in-series to a second resistor, and the tunable resistance value is based on one or more resistance selections signals received by the configurable RC filter circuitry.

20. The method of claim 15, further comprising:

tuning a tunable capacitance value of a tunable capacitor of the configurable RC filter circuitry based on one or more capacitance selection signals received by the configurable RC filter circuitry, wherein the tunable capacitor comprises a first capacitor coupled in-parallel to a second capacitor, and the tunable capacitance value is based on one or more capacitance selections signals received by the configurable RC filter circuitry.

* * * * *